United States Patent [19]

Edwards

[11] 4,011,509

[45] Mar. 8, 1977

[54] APPARATUS FOR RELATIVE POWER MEASUREMENTS IN A POWER METER

[75] Inventor: Allen P. Edwards, Palo Alto, Calif.

[73] Assignee: Hewlett-Packard Company, Palo Alto, Calif.

[22] Filed: Apr. 14, 1975

[21] Appl. No.: 567,587

[52] U.S. Cl. .......................... 324/142; 235/92 CA; 328/145

[51] Int. Cl.² .................................... G01R 11/16

[58] Field of Search ................. 324/142; 235/92; 328/145

[56] References Cited

UNITED STATES PATENTS 3,064,889  11/1962  Hupp ........................... 235/92
3,497,683  2/1970  Jordan et al. .................. 235/92
3,501,696  3/1970  Riley ............................ 324/95
3,879,668  4/1975  Edwards ....................... 328/145

Primary Examiner—Rudolph V. Rolinec
Assistant Examiner—Vincent J. Sunderdick
Attorney, Agent, or Firm—David A. Boone; Patrick J. Barrett

[57] ABSTRACT

A digital circuit for use in a power meter provides relative power measurements by storing a value representing a first power measurement and using that value as a reference for processing subsequent power measurements.

9 Claims, 3 Drawing Figures

APPARATUS FOR RELATIVE POWER MEASUREMENTS IN A POWER METER

BACKGROUND AND SUMMARY OF THE INVENTION

Relative power measurements (i.e. obtaining the ratio of the power value of two signals) are required in many applications. For example, in network analysis the relative value of the input and output signals is a measure of circuit performance. It is inconvenient to manually record and subtract the two values expressed in decibels (dB) to obtain a relative power measurement, particularly when a great many such measurements must be taken. Also, there is a possibility of error in the recording and the arithmetic if manual methods are used.

Some previous power meters have provided relative power measurements using analog techniques. For example, some have used analog logarithmic converters with their inherent inaccuracies while others have used complex analog ratio techniques.

The preferred embodiment of the present invention provides accurate relative power measurements by first converting the logarithm of the measured power values to digital form. A power measurement is selected to be the reference measurement and its value is stored in a register. Subsequent power measurement values are stored in a second register. These power values are digitally processed to provide the relative power measurement.

In the preferred embodiment, the relative value is provided in dB by first converting the power measurement values to their base 10 logarithms. The logarithm is taken relative to a fixed base such as 1 milliwatt (mW). Obtaining the difference between the two logarithms yields the ratio, in decibels, of the two power measurements. This is more clearly shown by the following equations:

$$\text{Relative Power in dB} = 10 \log \frac{P_2}{P_1} = 10 \log \frac{P_2}{P_F} - 10 \log \frac{P_1}{P_F}$$

$P_F$ is selected to be 1 mW in the preferred embodiment but may be any arbitrary value since it cancels out in the calculations, as shown above.

The conversion of an input signal to logarithmic form is fully explained in applicant's copending application entitled "Converter Circuit", Ser. No. 422,498, filed on Dec. 6, 1973, now U.S. Pat. No. 3,879,668.

DESCRIPTION OF THE PREFERRED EMBODIMENT

Figure 1:
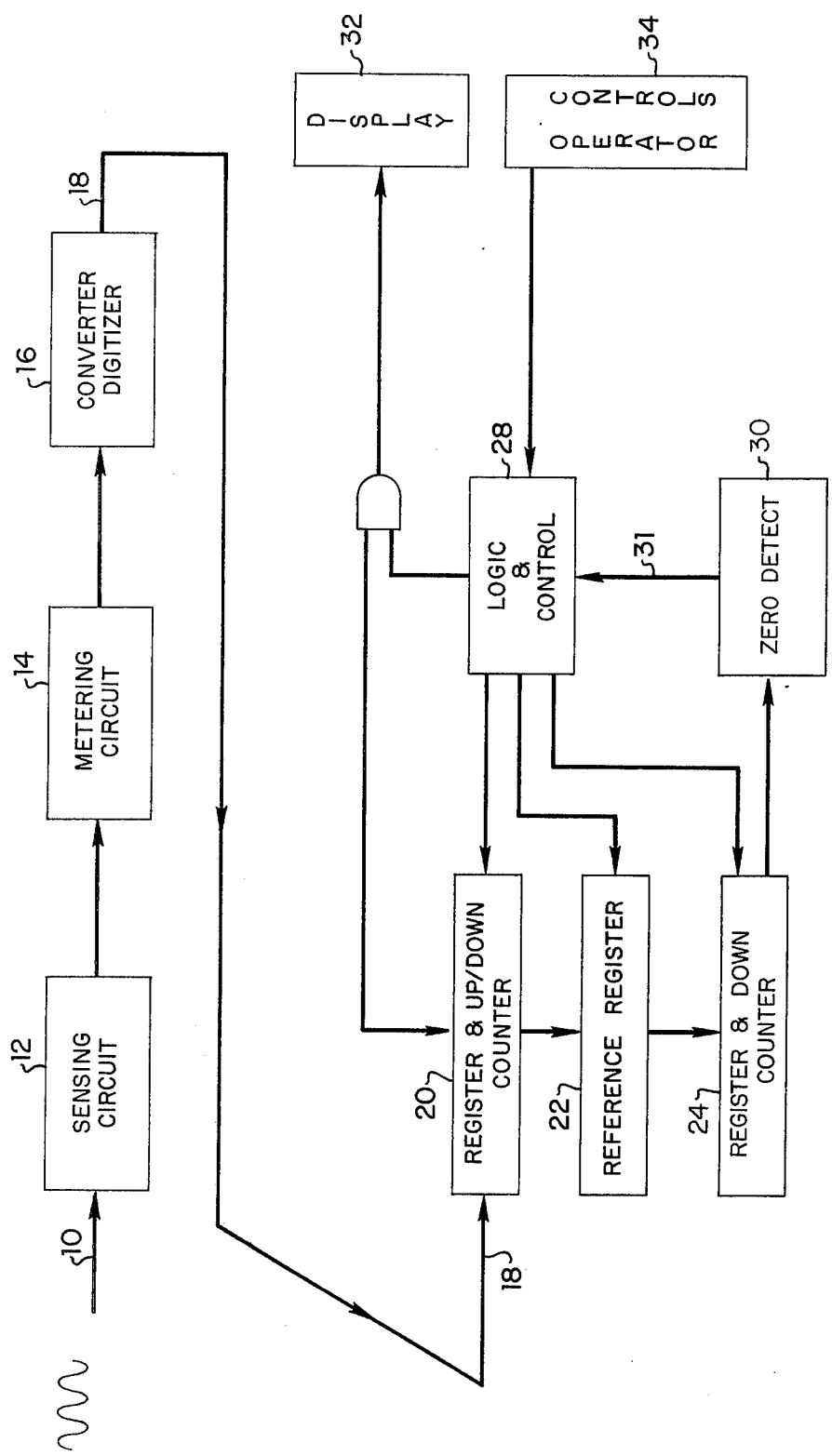
FIG. 1 is a block diagram of a power meter utilizing the preferred embodiment of the present invention.

Referring to the block diagram of FIG. 1, an input signal of unknown power is on line 10 and is processed by a sensing circuit 12, a metering circuit 14, and a converter-digitizer circuit 16 to produce a digital signal on line 18 which represents the logarithm of the power value of the input signal on line 10. The signal on line 18 is then stored in an up/down counter 20. Thereafter, the contents of counter 20 are gated to a display 32 to be viewed by the operator. Typical sensing and metering circuits are described in U.S. Pat. No. 3,501,696, entitled "Temperature Compensated R.F. Power Measuring Device Having Automatic Zero Setting Means" by Russell B. Riley.

Operator controls 34 are provided to receive commands from the operator. If the setting of operator controls 34 indicates that it is desired to obtain subsequent power measurements relative to the measurement value presently in counter 20, a logic and control circuit 28 will cause the contents of counter 20 to be stored in a register 22. This value is subsequently stored in a counter 24, as is more fully described below. The next power measurement value represented by signal on line 18 is stored in counter 20.

Logic and control circuit 28 then supplies signals to counters 20 and 24 to cause them to simultaneously operate as down counters. When counter 24 reaches the zero state, a zero detect circuit 30 produces a signal on line 31 to logic and control circuit 28 which then stops the down counting operation of counters 20 and 24. The relative power measurement is then present in counter 20. Thereafter, logic and control circuit 28 gates the contents of counter 20 to display 32. Since reference register 22 still contains the reference power measurement, the above process may be repeated to obtain any number of power measurements relative to the same reference. Power measurements may also be taken relative to a preselected value by having logic and control 28 cause reference register 22 to be set to the preselected value any time prior to beginning the down counting operation of registers 20 and 24.

Figure 2:
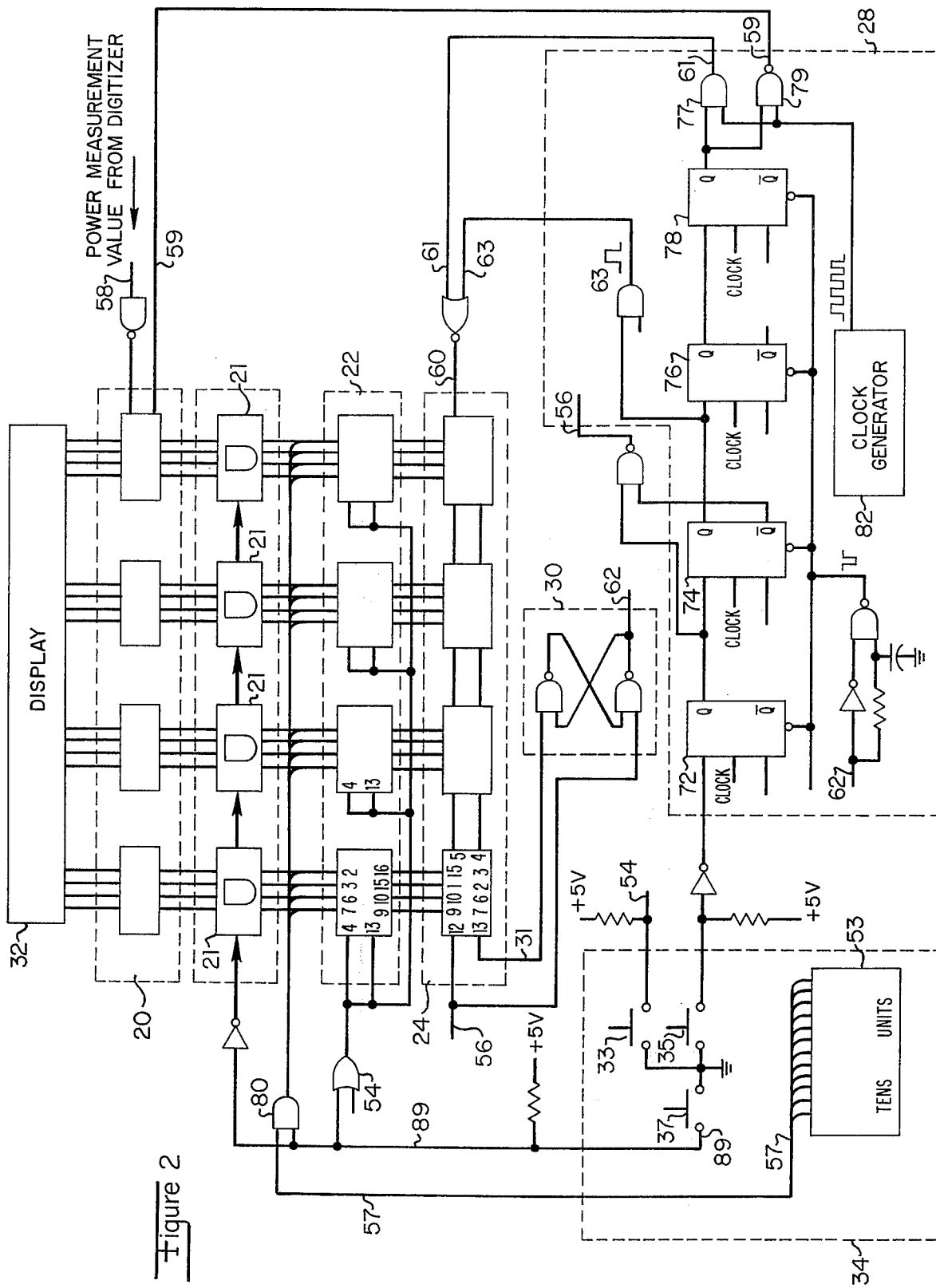
FIG. 2 is a detailed schematic of the preferred embodiment.

Referring now to the detailed schematic diagram of FIG. 2, the digitized logarithm of the power measurements are received by counter 20 on line 58 from converter-digitizer 16. Power measurements which are desired to be saved as reference values are loaded into register 22 by a signal on line 54. When it is desired to obtain the relative value of a power measurement in counter 20 with respect to a reference value in reference 22, the following sequence of operations is performed. The contents of register 22 (the logarithm of the reference power value) are loaded into counter 24 by a signal on line 56. Counter 24 and counter 20 are then operated in the down count mode by signals on lines 60 and 59 until counter 24 reaches the zero state. At this time the counting down operation is terminated. The relative power measurement is then in counter 20. Since the logarithms of the two power values were used, counter 20 contains the ratio, measured in decibels, of the power values of the two signals.

The signals controlling the operation of counters 20 and 24 and register 22 are generated by control circuit 28 and operator controls 34 which are shown at the bottom of FIG. 2. Operator control switch 33 produces the signal on line 54 when actuated. The operator actuates this switch when he desires to store the contents of counter 20 into register 22 for subsequent use as a reference power value. If it is desired to use a predetermined power value as the reference, selector switches 53, which are rotary switches in the preferred embodiment, are positioned to generate signals on bus 57 representing the desired value. These signals are stored in reference register 22 when switch 37 is actuated by the operator and generates the signal on line 89. Gate 80 represents whatever number of gates may be required to couple the selector switches to the appropriate inputs of register 22. The signal on line 89 simultaneously disables gates 21 to decouple counter 20 from register 22.

Once a reference value has been loaded in register 22, processing of power measurements in register 20 may begin. Assume that the contents of register 20 represent a power value which the operator desires to have processed to obtain the relative value between it and the contents of reference register 22. The operator simply actuates switch 35 to begin the circuit operation which will leave the relative power measurement in register 20.

Actuation of switch 35 sets flip-flop (FF) 72 on the first clock cycle. The Q output of FF 72 generates the signal on line 56 which causes the contents of reference register 22 to be stored in counter 24. FF's 74, 76, and 78 are in the reset state at this time. Clock generator 82 is simply a free running multivibrator in the preferred embodiment.

Zero detect circuit 30 is actually monitoring the "borrow" signal from the last counter state of counter 24 and not decoding the presence of all zeros at every counter stage. This minimizes the circuitry required but also means that zero detect circuit 30 is activated by the transition from zero to minus one, not the zero state. Therefore, to stop the simultaneous down counting of counters 20 and 24 at the proper time, counter 24 is set one count cycle ahead of counter 20. At the second clock cycle, FF 74 will be set. Since FF 76 is reset, a signal on line 63 is generated which generates a signal on line 60. The signal on line 60 causes counter 24 to count down one cycle before counting down from the value in counter 20 begins. The third clock cycle sets FF 76 which stops the generation of the signal on line 63.

Figure 3:
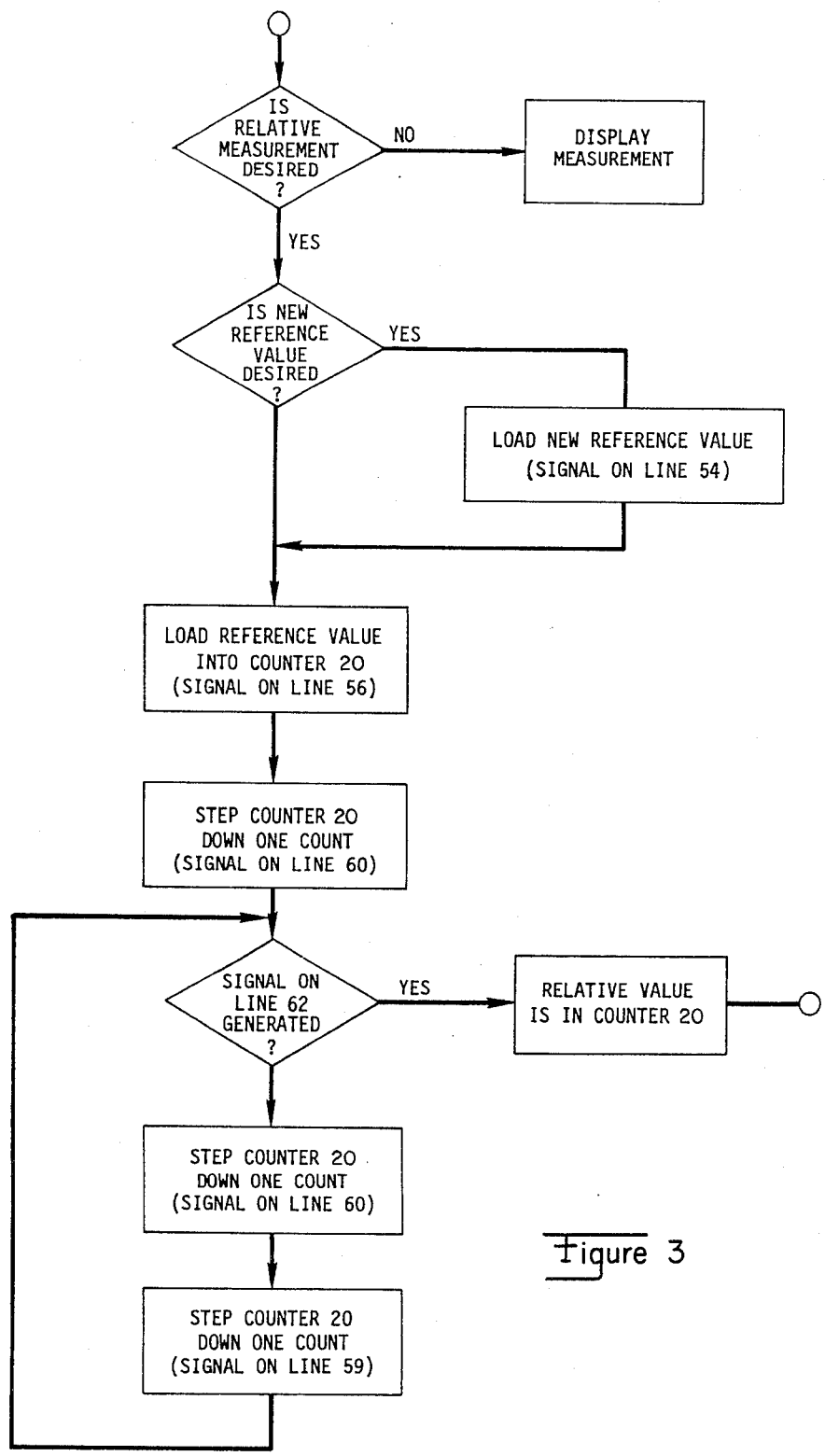
FIG. 3 is a flow chart of the processing done by the preferred embodiment to determine the relative power value.

The fourth clock cycle sets FF 78 which enables gates 77 and 79 to provide the clock signal on lines 59 and 61 which cause counters 20 and 24 to count down one cycle for each clock pulse. When zero detect circuit 30 detects the borrow signal on line 31 from the last counter stage of counter 24, a signal is generated on line 62 which resets flip-flops 72, 74, 76, and 78. This stops the counting operation of counters 20 and 24 since FF 78 no longer enables gates 77 and 79 to provide the clock signals on lines 59 and 61, and also prepares the circuitry for the next relative measurement cycle. After the computation is completed, the relative value may be viewed in display 32. The logical sequence of steps performed by the control logic of the preferred embodiment is also shown by the flow chart of FIG. 3.

The circuitry shown in FIG. 2 may be constructed using commercially available digital circuits and is not limited to any particular logic family. For counters 20 and 24, the preferred embodiment used integrated circuits similar to the SN74192 which are manufactured by Texas Instruments and others. Register 22 is constructed of integrated circuits similar to the SN7475 which are also manufactured by Texas Instruments and others.

There are other ways of providing the functions of the above circuits without departing from the spirit of the invention. For example, if a microprocessor is utilized to control other functions within the power meter, it is a simple task to include a microprogram to perform the logical operations shown by the flow chart in FIG. 3.

I claim:

1. In combination with a power meter of the type wherein an input sensing circuit, a metering circuit, and a digitizer are provided for producing a digital signal representing the power value of an input signal, the improvement which comprises:

register means for storing a reference digital signal representing a reference power value; and a digital circuit coupled to the register means and coupled to the digitizer for processing the digital signal with respect to the reference digital signal to provide an output signal representing the relative value of the digital signal with respect to the reference digital signal.

2. The combination as in claim 1 wherein the improvement further comprises:

operator controls coupled to the digital circuit and to the register means for providing control signals to cause electrical signals representing the power value of an input signal to be stored in the register means for subsequent use as the reference digital signal.

3. The combination as in claim 2 wherein the operator controls include selection means for inputting predetermined reference values, said selection means being coupled to the digital circuit for providing the electrical signals representing the reference power value for use as the reference digital signal.

4. The combination as in claim 3 wherein the digital circuit includes a first counter circuit for storing the digital signal and a second counter circuit for storing the reference digital signal.

5. The combination as in claim 4 wherein the improvement further comprises:

display means coupled to the digital circuit for providing the operator with visual indications of the power value of the input signal and the relative power of the input signal with respect to the reference power value.

6. A power meter comprising:

input means for receiving an input signal of unknown power;

metering means coupled to the input means for receiving the input signal therefrom and for producing a first output signal representing the power value of said input signal;

digitizer means coupled to the metering means for producing a digital signal representing the power value of the input signal in response to said first output signal;

register means for storing a reference digital signal representing a reference power value; and a digital circuit coupled to the digitizer and to the register means for processing the digital signal with respect to the reference digital signal to provide a second output signal representing the relative value of the digital signal with respect to the reference digital signal.

7. A power meter as in claim 6 wherein the digital circuit further includes:

means for storing digital electrical signals representing the power value of an input signal for subsequent use as the reference digital signal.

8. A power meter as in claim 7, further comprising:

display means coupled to the digital circuit for providing the operator with visual indications of the power value of the input signal and the relative power value of the input signal with respect to the reference power value.

9. A power meter as in claim 6 wherein the digitizer means includes a converter circuit for producing a signal representing the logarithm of the power value of the input signal in response to said first output signal, and the digital signal represents the logarithm of the power value of the input signal and the reference digital signal represents the logarithm of the reference power value, said output signal representing, in decibels, the ratio of the digital signal and the reference digital signal.

* * * * *